(12) United States Patent
Zhang et al.

(10) Patent No.: US 8,710,519 B2
(45) Date of Patent: *Apr. 29, 2014

(54) WHITE LIGHT EMITTING DIODE (LED) LIGHTING DEVICE

(75) Inventors: Ming Zhang, Sichuan (CN); Kun Zhao, Sichuan (CN); Dong-ming Li, Sichuan (CN)

(73) Assignee: Sichuan Sunfor Light Co., Ltd., Sichuan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/583,428

(22) PCT Filed: Jul. 9, 2010

(86) PCT No.: PCT/CN2010/075081
§ 371 (c)(1),
(2), (4) Date: Sep. 7, 2012

(87) PCT Pub. No.: WO2011/109975
PCT Pub. Date: Sep. 15, 2011

(65) Prior Publication Data
US 2013/0015474 A1    Jan. 17, 2013

(30) Foreign Application Priority Data

Mar. 12, 2010  (CN) .......................... 2010 1 0123249
May 21, 2010  (CN) .......................... 2010 1 0179197

(51) Int. Cl.
*H01L 33/50* (2010.01)

(52) U.S. Cl.
USPC ........... 257/88; 257/94; 257/98; 257/E33.061

(58) Field of Classification Search
USPC .................................... 257/13, 79–103, 918,
257/E51.018–E51.022, E33.001–E33.077,
257/E33.054, E25.028, E25.032
See application file for complete search history.

(56) References Cited

U.S. PATENT DOCUMENTS 8,269,410 B2 * 9/2012 Kijima et al. .................. 313/501
2010/0006875 A1 * 1/2010 Naum et al. .................... 257/94

OTHER PUBLICATIONS

International Search Report mailed Dec. 9, 2010, issued in PCT/CN2010/075081.

* cited by examiner

*Primary Examiner* — Mamadou Diallo
(74) *Attorney, Agent, or Firm* — Michael Ye; Andrews Kurth LLP

(57) ABSTRACT

An alternating current (AC) white LED lighting device and a method for manufacturing the same are provided. The AC white LED lighting device consists of blue, violet or ultraviolet LED chips, blue afterglow luminescence materials A and yellow luminescence materials B. Wherein the weight ratio of the blue afterglow luminescence materials A to the yellow luminescence materials B is 10-70 wt %:30-90 wt %. Because of using afterglow luminescence materials, the light will be sustained when an excitation light source disappears, which can eliminate the influence of LED chips light output variation due to the AC fluctuation on the lighting device. And the problem of the heating of the chips also can be overcome. At the same time, the influence of temperature quenching effect and direction change of the AC current on the AC white LED lighting device is eliminated.

20 Claims, 3 Drawing Sheets

WHITE LIGHT EMITTING DIODE (LED) LIGHTING DEVICE

FIELD

The present invention relates to an alternating current (AC) white LED lighting device and a method for manufacturing the same, which belong to the field of LED manufacturing. The present invention more particularly relates to a method for preparing an AC white LED lighting device using blue afterglow luminescence materials and yellow luminescence materials.

BACKGROUND

Currently, the LED is used in the fields such as lighting, display, backlight, etc., and as the most promising lighting means of the next generation, the LED gains extensive attention with the advantages of being energy saving, durable, pollution free, etc. There are many solutions for implementing the white LED, wherein the most mature technical solution for preparing the white LED at present is to realize the white light emission using a combination of the blue LED chip and the yellow phosphor. Volume 11 page 53 of *Appl. Phys. Lett.* published in 1967 reports a luminescence material $Y_3Al_5O_{12}:Ce^{3+}$, which has a yellow luminescence with a maximum light-emitting wavelength of 550 nm and a life of less than 100 ns. Volume 64 page 417 of *Appl. Phys. A* published in 1997 reports that the white LED light emission is realized using the yellow luminescence of $Y_3Al_5O_{12}:Ce^{3+}$ and the blue gallium nitride, and such technology is the most mature technical solution for preparing the white LED at present. But in practical applications, with the rise of the device temperature during working, the luminescence intensities of the blue LED chip and the phosphor will both decrease, and the luminescence intensity of the phosphor decreases more obviously, which influences the usage of the LED. The conventional LED is driven by the direct current (DC), but at present, the alternating current is mainly used in houses, industries, commerce and public facilities. Thus when the LED is used for lighting, a rectifier transformer must be accompanied for an AC/DC conversion to ensure the normal operation of the LED. However, there is a power loss up to 15~30% during the AC/DC conversion, and the cost of the conversion device is large. In addition, the installation requires a lot of labor and time, and the efficiency is not high. The Chinese patent No. CN100464111C discloses an AC LED lamp using LED chips of different colors connected in parallel in an AC power source. The patent mainly describes that the LED chips of different colors together form white light, and recites the specific circuit such as red, green and blue light emitting chips, without mentioning the luminescence powder. The U.S. Pat. No. 7,489,086, B2 discloses an AC LED driving apparatus and a lighting device using the same. The patent also emphasizes on the circuit structure without making an innovation report about the luminescence powder, and the conventional luminescence powder $Y_3Al_5O_{12}:Ce^{3+}$ is still employed. The inventor of the present invention researches a luminescence material $Y_2O_3.Al_2O_3.SiO_2:Ce.B.Na.P$ having the yellow long afterglow phenomenon and a white LED lighting device using the same (the Chinese patent application No. 200910307357.3).

Currently, the AC white LED lighting device still needs to be researched to overcome the influence of the temperature quenching effect and the direction change of AC current on the AC white LED lighting device, so as to provide more choices in the field of white LED lighting.

SUMMARY

The objective of the present invention is to provide a new white LED lighting device.

The technical solution of the present invention: blue LED chips or ultraviolet chips+blue afterglow luminescence materials A+yellow luminescence materials B. Wherein the weight ratio of the blue afterglow luminescence materials A to the yellow luminescence materials B is 10-70 wt %:30-90 wt %, and preferably 20-50 wt %:50-80 wt %.

Further, the blue afterglow luminescence material A has a peak light-emitting wavelength of 440~490 nm.

Further, the blue afterglow luminescence material A is at least one of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$.

The yellow luminescence material B has a peak light-emitting wavelength of 520~580 nm.

Further, the yellow luminescence material B is a luminescence material having or not having the afterglow phenomenon, or a combination thereof.

Further, the yellow luminescence material B is at least one of $Y_2O_3.Al_2O_3.SiO_2:Ce.B.Na.P$, $Y_2O_2S:Mg,Ti$, $Sr_3SiO_5:Eu^{2+},Dy^{3+}$, $Ca_2MgSi_2O_7:Eu^{2+},Dy^{3+}$, $CaS:Sm^{3+}$, YAG:Ce and TAG:Ce.

The white light emitted by the white LED lighting device of the present invention is formed of the blue light emitted by the blue afterglow luminescence powder, the yellow light emitted by the yellow luminescence powder and the light from the blue or ultraviolet LED chip under the excitation of the chip.

The above luminescence powder may also be excited by the violet and ultraviolet LED chips, thereby achieving the same effect.

The luminescence coating of the present invention may be formed by mixing the blue afterglow luminescence materials A and the yellow luminescence materials B, or coating the blue afterglow luminescence materials A on the chips and then coating the yellow luminescence materials B on the blue afterglow luminescence materials A.

The principle of the AC white LED lighting device of the present invention is as follows:

From the schematic diagram of the basic module of the AC LED lighting device as shown in FIG. 1, it can be seen that due to the periodic characteristic of the AC current, the luminescence of the LEDs based on the module also has a periodic bright-dark change, i.e., luminescence strobing, thereby influencing the usage of the device.

The present invention employs the luminescence materials having the afterglow characteristics so that the light will be sustained when the excitation light source disappears, thus in the AC white LED lighting device based on the solution of the present invention, when the current cycle is changed, the blue afterglow material will emit the blue afterglow to compensate the blue light and excite the yellow luminescence powder, thereby eliminating the influence of the luminescence strobing of the LED chip caused by the AC fluctuation on the lighting device, so that the light output of the device during the AC cycle is kept stable. In addition, since the LED chip does not work in a half of each AC cycle, the thermal effect decreases, which is beneficial to overcome the series of difficulties caused by chip heating in the usage of the existing white LED lighting device.

Figure 1:
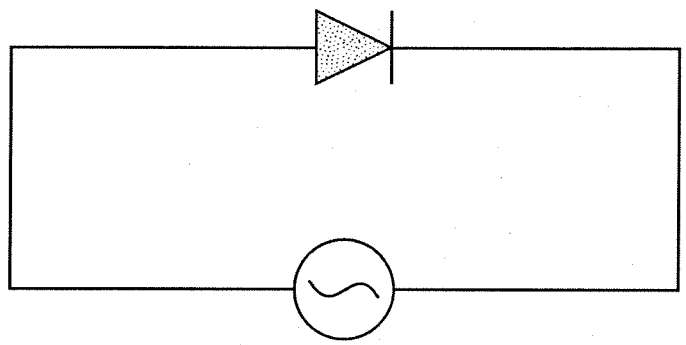
FIG. 1 is a schematic diagram of a basic LED module of an AC LED lighting device.
Figure 2:
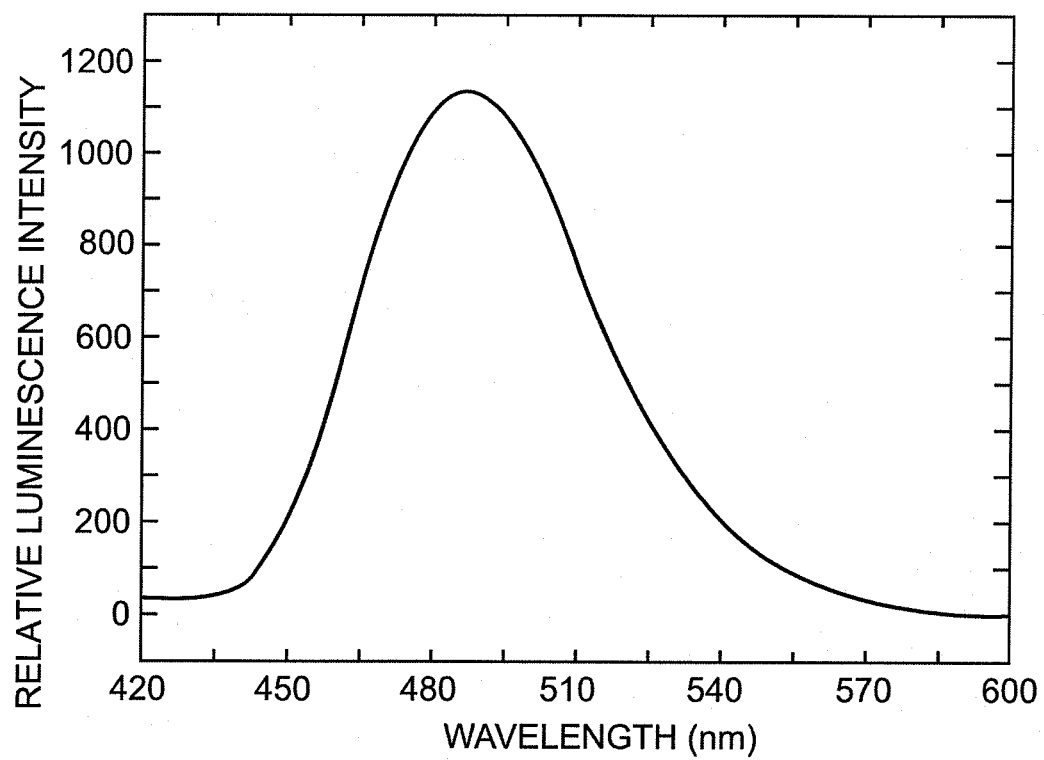
FIG. 2 is an afterglow spectrum of $Sr_4Al_{14}O_{25}:Eu^{2+},Dy^{3+}$.
Figure 3:
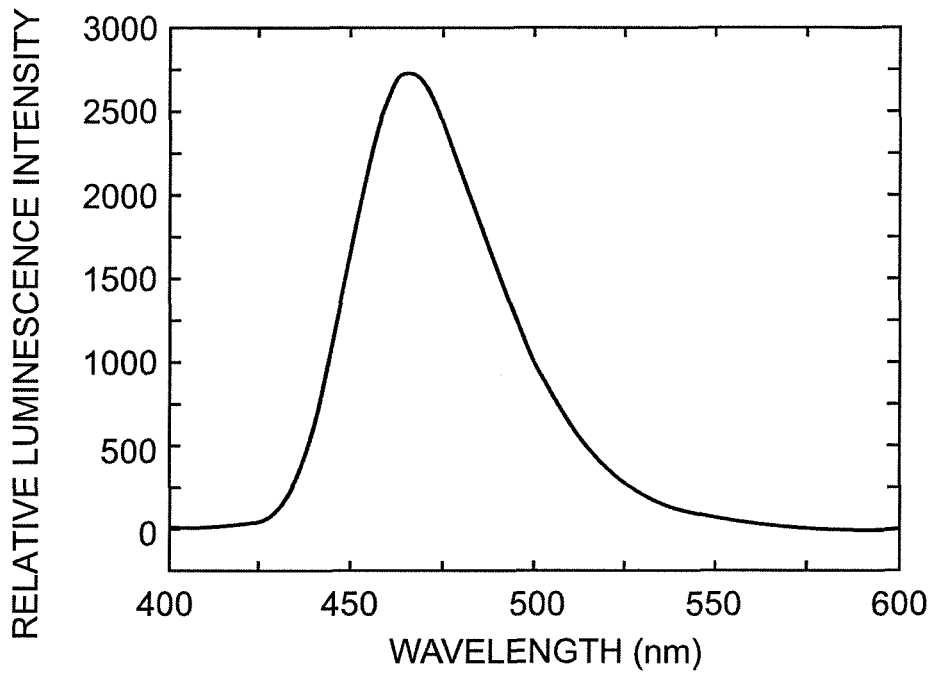
FIG. 3 is an afterglow spectrum of $Sr_2MgSi_2O_7:Eu^{2+}, Dy^{3+}$.
Figure 4:
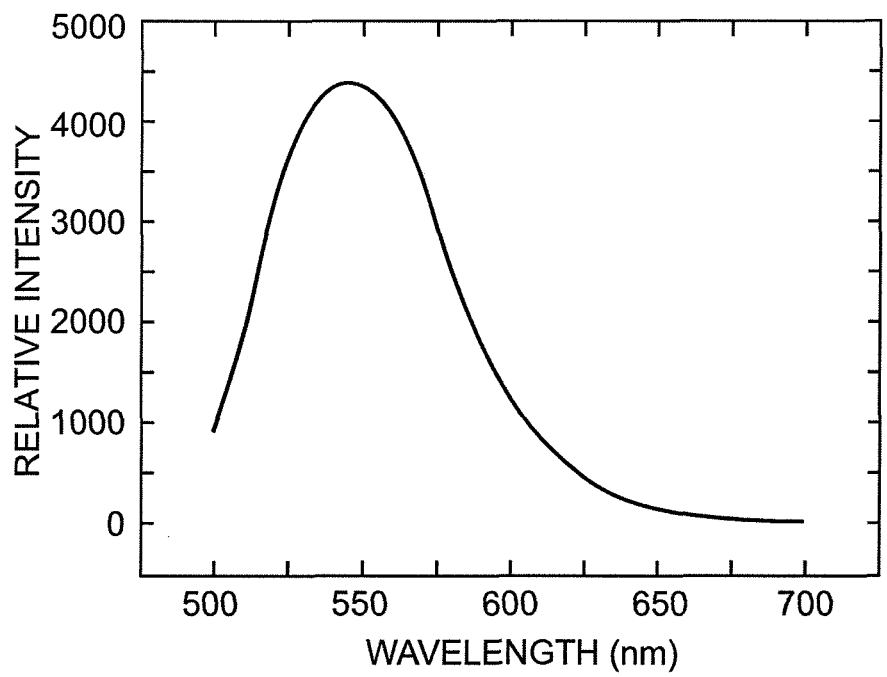
FIG. 4 is a photoluminescence spectrum of $Y_2O_3.Al_2O_3.SiO_2:Ce.B.Na.P$.
Figures 1, 5:
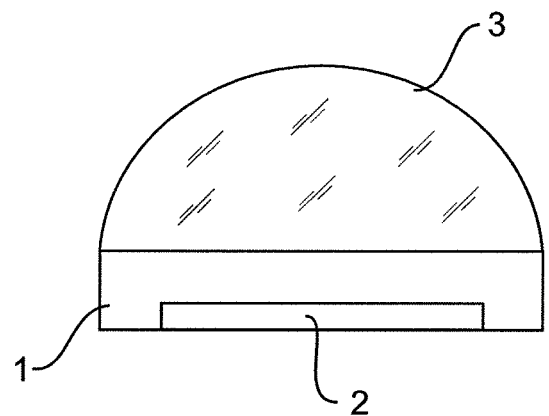
FIG. 5 is a schematic diagram of the structure of an LED luminescence unit, in FIG. 5-1, 1 denotes a mixed luminescence coating made of blue afterglow luminescence materials A and yellow luminescence materials B; 2 denotes a blue, violet or ultraviolet LED chip; and 3 denotes a lens; and in FIG. 5-2, 2 denotes a blue, violet or ultraviolet LED chip; 3 denotes a lens; 5 denotes a coating made of blue afterglow luminescence materials A; and 4 denotes a coating made of yellow luminescence materials B.
Figures 2, 5:
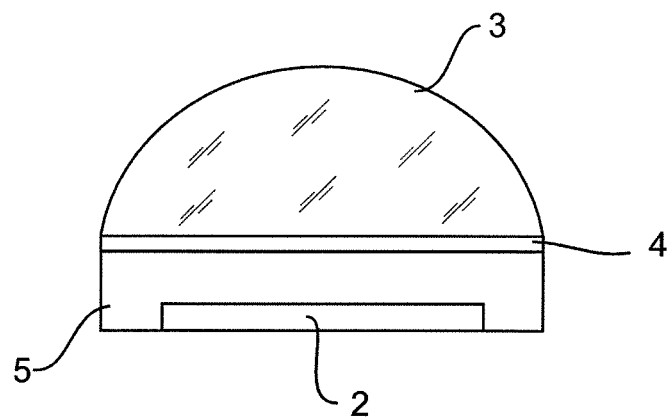

The above contents of the present invention are further described in details through the following embodiments in the form of examples. But it shall be appreciated that the subject scope of the present invention is not limited to the following examples, and any technology implemented by the above contents of the present invention shall fall within the scope of the present invention. Particularly, about the basic circuit structure, the examples of the present invention only give the simplest unidirectional series circuit, but the circuit of the AC LED lighting device of the present invention is not limited thereto and it includes, for example, the reverse series-parallel circuit and the bridge circuit. In the examples, the blue LED chip has an emission wavelength of 460 nm, the violet LED chip has an emission wavelength of 400 nm, and the ultraviolet LED chip has an emission wavelength of 365 nm.

DETAILED DESCRIPTION OF THE PREFERRED EMBODIMENTS

A new white LED lighting device consists of blue LED chips, blue afterglow luminescence materials A and yellow luminescence materials B. Wherein the weight ratio of the blue afterglow luminescence materials A to the yellow luminescence materials B is 10-70 wt %:30-90 wt %, and preferably 20-50 wt %:50-80 wt %.

Wherein the blue afterglow luminescence material A has a peak light-emitting wavelength of 440-490 nm, e.g., it may be one or combinations of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$.

The yellow luminescence material B may be a luminescence material having or not having the afterglow phenomenon, or a combination thereof, with a peak light-emitting wavelength of 520-580 nm. The luminescence material having the afterglow phenomenon includes Ce-activated $Y_2O_3.Al_2O_3.SiO_2:Ce.B.Na.P$, $Y_2O_2S:Mg,Ti$, $Sr_3SiO_5:Eu^{2+},Dy^{3+}$, $Ca_2MgSi_2O_7:Eu^{2+},Dy^{3+}$ and $CaS:Sm^{3+}$. The luminescence material not having the afterglow phenomenon includes YAG:Ce and TAG:Ce.

The white light emitted by the white LED lighting device of the present invention is formed of the blue light emitted by the blue afterglow luminescence powder, the yellow light emitted by the yellow luminescence powder and the light from the blue LED chip under the excitation of the blue LED chip.

The AC white LED lighting device of the present invention may implement the AC input by connecting two reverse LEDs or bridge circuits in parallel. However, due to the periodic characteristic of the AC current, the luminescence of the LEDs based on the two modules also has a periodic bright-dark change, i.e., luminescence strobing, thereby influencing the usage of the device.

The present invention employs the luminescence materials having the afterglow characteristics so that the light will be sustained when an excitation light source disappears, thus in the AC white LED lighting device based on the solution of the present invention, when the current cycle is changed, the blue afterglow material will emit the blue afterglow to compensate the blue light and excite the yellow luminescence powder, thereby eliminating the influence of the luminescence strobing of the LED chip caused by the AC fluctuation on the lighting device, so that the light output of the device during the AC cycle is kept stable. In addition, since the LED chip does not work in a half of each AC cycle, the thermal effect decreases, which is beneficial to overcome the series of difficulties caused by chip heating in the usage of the existing white LED lighting device.

The specific examples are given as follows.

Examples 1-18

| Example | LED chip | Blue afterglow luminescence material A (wt %) | Yellow luminescence material B (wt %) |
|---|---|---|---|
| 1 | Blue | 40% $Sr_4Al_{14}O_{25}: Eu^{2+}, Dy^{3+}$ | 60% $Y_2O_3 \cdot Al_2O_3 \cdot SiO_2: Ce \cdot B \cdot Na \cdot P$ |
| 2 | Blue | 35% $Sr_2MgSi_2O_7: Eu^{2+}, Dy^{3+}$ | 65% $Y_3Al_5O_{12}: Ce$ |
| 3 | Blue | 10% $Sr_2MgSi_2O_7: Eu^{2+}, Dy^{3+}$ +30% $Sr_4Al_{14}O_{25}: Eu^{2+}, Dy^{3+}$ | 60% $Tb_3Al_5O_{12}: Ce$ |
| 4 | Blue | 5% $Sr_2MgSi_2O_7: Eu^{2+}, Dy^{3+}$ +30% $Sr_4Al_{14}O_{25}: Eu^{2+}, Dy^{3+}$ +15% $CaS: Bi^{3+}, Na^+$ | 25% $Y_2O_3 \cdot Al_2O_3 \cdot SiO_2: Ce \cdot B \cdot Na \cdot P$ +10% $Sr_3SiO_5: Eu^{2+}, Dy^{3+}$ +15% $Ca_2MgSi_2O_7: Eu^{2+}, Dy^{3+}$ |
| 5 | Blue | 10% $Sr_2MgSi_2O_7: Eu^{2+}, Dy^{3+}$ +15% $CaSrS: Bi^{3+}$ +35% $Sr_4Al_{14}O_{25}: Eu^{2+}, Dy^{3+}$ +5% $CaS: Bi^{3+}, Na^+$ +5% $CaS: Cu^+, Na^+$ | 5% $Y_2O_2S: Mg,Ti$ +25% $Y_2O_3 \cdot Al_2O_3 \cdot SiO_2: Ce \cdot B \cdot Na \cdot P$ |
| 6 | Blue | 5% $Sr_2MgSi_2O_7: Eu^{2+}, Dy^{3+}$ +15% $CaSrS: Bi^{3+}$ +20% $Sr_4Al_{14}O_{25}: Eu^{2+}, Dy^{3+}$ | 15% $Sr_3SiO_5: Eu^{2+}, Dy^{3+}$ +20% $Ca_2MgSi_2O_7: Eu^{2+}, Dy^{3+}$ +25% $Y_3Al_5O_{12}: Ce$ |
| 7 | Blue | 35% $CaS: Bi^{3+}, Na^+$ | 25% $Y_2O_3 \cdot Al_2O_3 \cdot SiO_2: Ce \cdot B \cdot Na \cdot P$ +10% $CaS: Sm^{3+}$ +15% $Y_2O_2S: Mg, Ti$ +5% $Sr_3SiO_5: Eu^{2+}, Dy^{3+}$ +10% $Ca_2MgSi_2O_7: Eu^{2+}, Dy^{3+}$ |
| 8 | Violet | 45 % $Sr_4Al_{14}O_{25}: Eu^{2+}, Dy^{3+}$ | 55% $Y_2O_3 \cdot Al_2O_3 \cdot SiO_2: Ce \cdot B \cdot Na \cdot P$ |
| 9 | Violet | 40 % $Sr_2MgSi_2O_7: Eu^{2+}, Dy^{3+}$ | 60% $Y_3Al_5O_{12}: Ce$ |

-continued

| Example | LED chip | Blue afterglow luminescence material A (wt %) | Yellow luminescence material B (wt %) |
|---|---|---|---|
| 10 | Violet | 10 % $Sr_2MgSi_2O_7$: $Eu^{2+}$, $Dy^{3+}$ +35 % $Sr_4Al_{14}O_{25}$: $Eu^{2+}$, $Dy^{3+}$ | 55% $Tb_3Al_5O_{12}$: Ce |
| 11 | Violet | 5% $Sr_2MgSi_2O_7$: $Eu^{2+}$, $Dy^{3+}$ +25% $Sr_4Al_{14}O_{25}$: $Eu^{2+}$, $Dy^{3+}$ +15% CaS: $Bi^{3+}$, $Na^+$ | 25% $Y_2O_3$•$Al_2O_3$•$SiO_2$: Ce•B•Na•P +20% $Sr_3SiO_5$: $Eu^{2+}$, $Dy^{3+}$ +10% $Ca_2MgSi_2O_7$: $Eu^{2+}$, $Dy^{3+}$ |
| 12 | Violet | 10% $Sr_2MgSi_2O_7$: $Eu^{2+}$, $Dy^{3+}$ +10% CaSrS: $Bi^{3+}$ +35% $Sr_4Al_{14}O_{25}$: $Eu^{2+}$, $Dy^{3+}$ +5% CaS: $Bi^{3+}$, $Na^+$ +5% CaS: $Cu^+$, $Na^+$ | 10% $Y_2O_2S$: Mg, Ti +25% $Y_2O_3$•$Al_2O_3$•$SiO_2$: Ce•B•Na•P |
| 13 | Ultraviolet | 40% $Sr_2MgSi_2O_7$: $Eu^{2+}$, $Dy^{3+}$ | 60% $Y_3Al_5O_{12}$: Ce |
| 14 | Ultraviolet | 30% $Sr_4Al_{14}O_{25}$: $Eu^{2+}$, $Dy^{3+}$ | 70% $Tb_3Al_5O_{12}$: Ce |
| 15 | Ultraviolet | 20% $Sr_2MgSi_2O_7$: $Eu^{2+}$, $Dy^{3+}$ +35% $Sr_4Al_{14}O_{25}$: $Eu^{2+}$, $Dy^{3+}$ | 45% $Y_2O_3$•$Al_2O_3$•$SiO_2$: Ce•B•Na•P |
| 16 | Ultraviolet | 10% $Sr_2MgSi_2O_7$: $Eu^{2+}$, $Dy^{3+}$ +25% $Sr_4Al_{14}O_{25}$: $Eu^{2+}$, $Dy^{3+}$ +5% CaS: $Bi^{3+}$, $Na^+$ | 30% $Y_2O_3$•$Al_2O_3$•$SiO_2$: Ce•B•Na•P +15% $Sr_3SiO_5$: $Eu^{2+}$, $Dy^{3+}$ +15% $Ca_2MgSi_2O_7$: $Eu^{2+}$, $Dy^{3+}$ |
| 17 | Ultraviolet | 15% $Sr_2MgSi_2O_7$: $Eu^{2+}$, $Dy^{3+}$ +5% CaSrS: $Bi^{3+}$ +10% $Sr_4Al_{14}O_{25}$: $Eu^{2+}$, $Dy^{3+}$ +5% CaS: $Bi^{3+}$, $Na^+$ +5% CaS: $Cu^+$, $Na^+$ | 20% $Y_2O_2S$: Mg, Ti +40% $Y_2O_3$•$Al_2O_3$•$SiO_2$: Ce•B•Na•P |
| 18 | Ultraviolet | 10% $Sr_2MgSi_2O_7$: $Eu^{2+}$, $Dy^{3+}$ +5% CaSrS: $Bi^{3+}$ +35% $Sr_4Al_{14}O_{25}$: $Eu^{2+}$, $Dy^{3+}$ | 15% $Sr_3SiO_5$: $Eu^{2+}$, $Dy^{3+}$ +15% $Ca_2MgSi_2O_7$: $Eu^{2+}$, $Dy^{3+}$ +20% $Y_3Al_5O_{12}$: Ce |

The preparation method is as follows: 500-mesh-screening luminescence materials A and B, uniformity mixing the luminescence materials A and B in the ratios described in Examples 1-18, and packing them with an LED chip having the power of 0.1 W, so as to form an AC white LED lighting device with its basic unit as shown in FIG. 1.

Test Example 1

Luminescence Characteristics of the AC LED Lighting Device of the Present Invention The frequency of the common AC current is 50 Hz, i.e., the cycle is 20 ms. The current direction is not changed while the current magnitude changes per half cycle (i.e., 10 ms). Table 2 gives the brightness within 20 ms tested by the lighting device shown as the module in FIG. 1 with a high-speed camera shooting 300 photos per second, when the LED chips given in Examples 1-18 are directly voltage-reduced by the mains supply without being powered by an AC-DC conversion. The reference sample is an AC LED lighting device formed in the same manner with a white LED chip having the commercially available blue chip packed with the yellow luminescence material. The brightness data in Table 2 is the relative test brightness of the instrument and has no dimension.

TABLE 2

| | Time | | | | | |
|---|---|---|---|---|---|---|
| | 3.33 ms | 6.66 ms | 9.99 ms | 13.32 ms | 16.65 ms | 19.98 ms |
| Brightness of Reference sample | 2856 | 3266 | 2900 | 0 | 0 | 0 |
| Brightness of example 1 | 2786 | 2878 | 2735 | 2087 | 1900 | 1816 |
| Example 2 | 2760 | 2930 | 2710 | 2000 | 1852 | 1783 |
| Example 3 | 2686 | 2763 | 2615 | 1947 | 1832 | 1700 |
| Example 4 | 2800 | 2915 | 2875 | 2111 | 1995 | 1863 |
| Example 5 | 2532 | 2621 | 2512 | 1869 | 1814 | 1711 |
| Example 6 | 2611 | 2774 | 2649 | 2001 | 1931 | 1801 |
| Example 7 | 2300 | 2423 | 2400 | 1604 | 1542 | 1488 |
| Example 8 | 2800 | 2958 | 2889 | 2100 | 2004 | 1950 |
| Example 9 | 2700 | 2860 | 2700 | 1999 | 1900 | 1746 |
| Example 10 | 2333 | 2621 | 2536 | 1900 | 1632 | 1423 |
| Example 11 | 2597 | 2741 | 2635 | 1815 | 1763 | 1600 |
| Example 12 | 2122 | 2429 | 2235 | 1522 | 1400 | 1283 |
| Example 13 | 2633 | 2777 | 2654 | 1757 | 1583 | 1489 |
| Example 14 | 2763 | 2810 | 2777 | 1997 | 1835 | 1711 |
| Example 15 | 2343 | 2661 | 2532 | 1870 | 1732 | 1554 |
| Example 16 | 2637 | 2788 | 2700 | 1800 | 1712 | 1611 |
| Example 17 | 2322 | 2529 | 2435 | 1612 | 1506 | 1383 |
| Example 18 | 2683 | 2797 | 2701 | 1857 | 1665 | 1500 |

As can be seen from the data in Table 2, the luminescence of the present invention is stable during the AC cycle, while the luminescence of the white LED lighting device having the commercially available blue chip packed with the yellow luminescence material is unstable, and no light is emitted during the negative half cycle of the AC current due to voltage reverse.

Test Example 2

Light Attenuation of the AC LED Lighting Device of the Present Invention

Table 3 shows the light attenuation data of Examples 1-18 and the reference sample. The reference sample is a lighting device formed by installing the white LED chip having the commercially available blue chip packed with the yellow luminescence material in the general DC power supply mode at present. The test method is as follows: powering on the AC LED lighting devices of Examples 1-18 and the reference sample, and testing their brightness at a certain interval. The results are shown in Table 3, wherein the data is relative brightness and normalized with the initial data.

TABLE 3

| Time | 1 h | 1000 h | 1500 h | 2500 h |
|---|---|---|---|---|
| Brightness of Reference sample | 100 | 98 | 97 | 94 |
| Brightness of example 1 | 100 | 99.8 | 99.3 | 99.2 |
| Example 2 | 100 | 99.5 | 99.2 | 99 |
| Example 3 | 100 | 99.5 | 99 | 98 |
| Example 4 | 100 | 99.7 | 99.3 | 99 |
| Example 5 | 100 | 99.8 | 99.4 | 98.6 |
| Example 6 | 100 | 99.5 | 99 | 98 |
| Example 7 | 100 | 99.4 | 99 | 98.3 |
| Example 8 | 100 | 99.7 | 99.2 | 99 |
| Example 9 | 100 | 99.5 | 99 | 98 |
| Example 10 | 100 | 99.6 | 99 | 98.6 |
| Example 11 | 100 | 99.5 | 99 | 98 |
| Example 12 | 100 | 99.3 | 99 | 98.2 |
| Example 13 | 100 | 99.5 | 99 | 98 |
| Example 14 | 100 | 99.6 | 99.1 | 98 |
| Example 15 | 100 | 99.5 | 99 | 98 |
| Example 16 | 100 | 99.8 | 99.2 | 99 |
| Example 17 | 100 | 99.4 | 99.1 | 98.5 |
| Example 18 | 100 | 99.5 | 99.3 | 98.4 |

As can be seen from the data in Table 3, the brightness attenuation of the AC white LED lighting device of the present invention is less than that of the LED lighting device using the existing mode.

The data of Tables 2-3 indicates that the AC white LED lighting device prepared with the blue afterglow luminescence materials and the yellow luminescence materials in the present invention is advantageous in stable luminescence and small light attenuation during the AC power supplying, thereby having obvious novelty and inventiveness over the existing LED lighting device.

What is claimed is:

1. A white LED lighting device, characterized in that the white LED lighting device comprises blue, violet or ultraviolet LED chips and luminescence material, the luminescence material being a combination of blue afterglow luminescence material A and yellow luminescence material B, the yellow luminescence material B being able to emit light under excitation of the blue, violet or ultraviolet LED chips and/or excitation of the blue afterglow luminescence material A,
a weight ratio (A:B) between the blue afterglow luminescence material A and the yellow luminescence material B being 10~70 wt %: 30~90 wt %, the white LED lighting device being driven with an alternating current having a power frequency of not less than 50 Hz.

2. The white LED lighting device according to claim 1, wherein a weight ratio (A:B) between the blue afterglow luminescence material A and the yellow luminescence material B is 20~50 wt %:50~80 wt %.

3. The white LED lighting device according to claim 1, wherein the blue, violet or ultraviolet LED chips are internally packed chips in the white LED lighting device.

4. The white LED lighting device according to claim 1, wherein the device has a luminescence coating employing the luminescence material.

5. The white LED lighting device according to claim 1, wherein the blue afterglow luminescence material A has a peak light-emitting wavelength of 440~490 nm.

6. The white LED lighting device according to claim 1, wherein the blue afterglow luminescence material A is at least one of $Sr_4Al_{14}O_{25}:Eu^{2+},Dy^{3+}$, $Sr_2MgSi_2O_7:Eu^{2+},Dy^{3+}$, $CaS:Bi^{3+},Na^+$, $CaS:Cu^+,Na^+$ and $CaSrS:Bi^{3+}$.

7. The white LED lighting device according to claim 1, wherein the yellow luminescence material B has a peak light-emitting wavelength of 520~580 nm.

8. The white LED lighting device according to claim 1, wherein the yellow luminescence material B is a yellow luminescence material with or without an afterglow phenomenon, or a combination thereof.

9. The white LED lighting device according to claim 1, wherein the yellow luminescence material B is at least one of $Y_2O_3.Al_2O_3.SiO_2:Ce.B.Na.P$, $Y_2O_2S:Mg,Ti$, $Sr_3SiO_5:Eu^{2+}$, $Dy^{3+}$, $Ca_2MgSi_2O_7:Eu^{2+},Dy^{3+}$, $CaS:Sm^{3+}$, YAG:Ce and TAG:Ce.

10. The white LED lighting device according claim 1, wherein the luminescence coating is formed by mixing the blue afterglow luminescence material A and the yellow luminescence material B.

11. The white LED lighting device according to claim 1, wherein the luminescence coating consists of a coating of the blue afterglow luminescence material A and a coating of the yellow luminescence material B.

12. The white LED lighting device according to claim 1, wherein the alternating current is an alternating current used in houses, industries, commerce and public facilities.

13. The white LED lighting device according to claim 2, wherein a weight ratio (A:B) between the blue afterglow luminescence material A and the yellow luminescence material B is 35~50 wt %:50~65 wt %.

14. The white LED lighting device according to claim 13, wherein a weight ratio (A:B) between the blue afterglow luminescence material A and the yellow luminescence material B is 40~50 wt %:50~60 wt %.

15. The white LED lighting device according to claim 14, wherein a weight ratio (A:B) between the blue afterglow luminescence material A and the yellow luminescence material B is 40 wt %:60 wt %.

16. The white LED lighting device according to claim 6, wherein the yellow luminescence material B is at least one of $Y_2O_3.Al_2O_3.SiO_2:Ce.B.Na.P$, $Y_2O_2S:Mg,Ti$, $Sr_3SiO_5:Eu^{2+}$, $Dy^{3+}$, $Ca_2MgSi_2O_7:Eu^{2+},Dy^{3+}$, $CaS:Sm^{3+}$, YAG:Ce and TAG:Ce.

17. The white LED lighting device according to claim 10, wherein the blue afterglow luminescence material A has a peak light-emitting wavelength of 440~490 nm, and wherein the yellow luminescence material B has a peak light-emitting wavelength of 520~580 nm.

18. The white LED lighting device according to claim 10, wherein the blue afterglow luminescence material A is at least one of $Sr_4Al_{14}O_{25}$:$Eu^{2+}$,$Dy^{3+}$, $Sr_2MgSi_2O_7$:$Eu^{2+}$,$Dy^{3+}$, CaS:$Bi^{3+}$,$Na^+$, CaS:$Cu^+$,$Na^+$ and CaSrS:$Bi^{3+}$, and wherein the yellow luminescence material B is at least one of $Y_2O_3 \cdot Al_2O_3 \cdot SiO_2$:Ce.B.Na.P, $Y_2O_2S$:Mg,Ti, $Sr_3SiO_5$:$Eu^{2+}$, $Dy^{3+}$, $Ca_2MgSi_2O_7$:$Eu^{2+}$,$Dy^{3+}$, CaS:$Sm^{3+}$, YAG:Ce and TAG:Ce.

19. The white LED lighting device according to claim 11, wherein the blue afterglow luminescence material A has a peak light-emitting wavelength of 440~490 nm, and wherein the yellow luminescence material B has a peak light-emitting wavelength of 520~580 nm.

20. The white LED lighting device according to claim 11, wherein the blue afterglow luminescence material A is at least one of $Sr_4Al_{14}O_{25}$:$Eu^{2+}$,$Dy^{3+}$, $Sr_2MgSi_2O_7$:$Eu^{2+}$,$Dy^{3+}$, CaS:$Bi^{3+}$,$Na^+$, CaS:$Cu^+$,$Na^+$ and CaSrS:$Bi^{3+}$, and wherein the yellow luminescence material B is at least one of $Y_2O_3 \cdot Al_2O_3 \cdot SiO_2$:Ce.B.Na.P, $Y_2O_2S$:Mg,Ti, $Sr_3SiO_5$:$Eu^{2+}$, $Dy^{3+}$, $Ca_2MgSi_2O_7$:$Eu^{2+}$,$Dy^{3+}$, CaS:$Sm^{3+}$, YAG:Ce and TAG:Ce.

* * * * *